United States Patent
Polei et al.

(12) 
(10) Patent No.: US 6,709,876 B2
(45) Date of Patent: Mar. 23, 2004

(54) METHOD FOR DETECTING REMOVAL OF ORGANIC MATERIAL FROM A SEMICONDUCTOR DEVICE IN A MANUFACTURING PROCESS

(75) Inventors: Veronika Polei, Bad Schandau (DE); Martin Welzel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/215,226

(22) Filed: Aug. 8, 2002

(65) Prior Publication Data

US 2003/0029838 A1 Feb. 13, 2003

(30) Foreign Application Priority Data

Aug. 8, 2001 (EP) .............................. 01119150

(51) Int. Cl.⁷ ...................... H01L 21/00; B08B 3/00; B44C 1/22; C03C 15/00; C03C 25/68; C23F 1/00
(52) U.S. Cl. ................... 438/7; 438/8; 438/9; 134/113; 216/85
(58) Field of Search ............... 438/7, 8, 9, 10, 438/13; 216/85; 134/113

(56) References Cited

U.S. PATENT DOCUMENTS

| | | | | |
|---|---|---|---|---|
| 4,731,154 A | * | 3/1988 | Hausman Hazlitt et al. | 216/85 |
| 4,996,160 A | * | 2/1991 | Hausman Hazlitt et al. | 436/2 |
| 5,489,361 A | | 2/1996 | Barbee et al. | |
| 5,622,636 A | | 4/1997 | Huh et al. | |
| 5,670,376 A | * | 9/1997 | Obeng | 436/55 |
| 5,922,606 A | * | 7/1999 | Jenkins et al. | 436/55 |
| 5,938,856 A | * | 8/1999 | Sachdev et al. | 134/1.3 |
| 5,969,805 A | * | 10/1999 | Johnson et al. | 356/72 |
| 6,013,156 A | * | 1/2000 | Holbrook et al. | 156/345.15 |
| 6,168,081 B1 | * | 1/2001 | Urano et al. | 235/462.27 |
| 6,203,659 B1 | * | 3/2001 | Shen et al. | 156/345.15 |
| 6,238,487 B1 | * | 5/2001 | Jenkins et al. | 134/2 |

FOREIGN PATENT DOCUMENTS

| | | |
|---|---|---|
| EP | 1 178 300 A1 | 2/2002 |
| JP | 60 136 229 | 7/1985 |
| JP | 03 022 531 | 1/1991 |

OTHER PUBLICATIONS

Van Zant, Microchip Fabrication, 4th ed. McGraw–Hill: New York, 2000, pp. 271–273.*

* cited by examiner

Primary Examiner—Erik Kielin
(74) Attorney, Agent, or Firm—Laurence A. Greenberg; Werner H. Stemer; Gregory L. Mayback

(57) ABSTRACT

In a method for removing an organic material from semiconductor devices, at least one semiconductor device is inserted into a so-called piranha bath. Measurement data are processed to get a data curve for measuring a concentration of at least one reaction product. The measurement data is queried for at least one of a turning point, a local maximum point or a local minimum point of the curve each being significantly different from signal noise after removing the semiconductor device from the fluid. With the information it is decided whether further processing of the semiconductor device is needed. The method is suitable for detecting an incomplete removal of organic material, i.e. photoresist deposited on the processed semiconductor device.

9 Claims, 3 Drawing Sheets

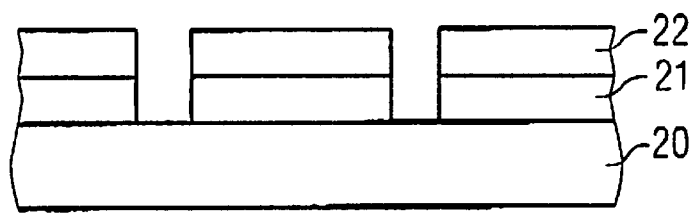
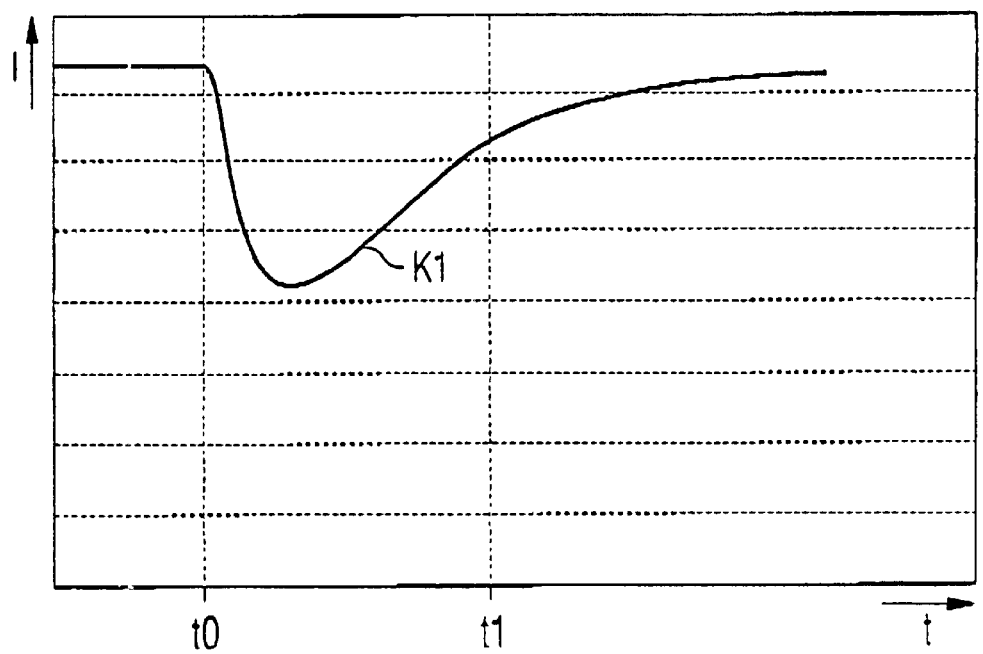

METHOD FOR DETECTING REMOVAL OF ORGANIC MATERIAL FROM A SEMICONDUCTOR DEVICE IN A MANUFACTURING PROCESS

BACKGROUND OF THE INVENTION

Field of the Invention

The present invention relates to a method for detecting removal of organic material from a semiconductor device in a manufacturing process. At least one semiconductor device with deposited organic material is inserted into a fluid for removing the organic material from the semiconductor device.

In the technical field of manufacturing of semiconductor devices, the semiconductor devices usually are formed like disks or wafers for producing e.g. semiconductor chips. In the process of manufacturing of e.g. a semiconductor wafer, it is common and necessary to apply various process steps to the wafer. Especially lithographic processes are applied frequently in the process. Before applying a lithographic process, the wafer usually is deposited with at least one material layer such as organic photoresist material. Structures over the front side of the wafer can be performed. The structured photoresist layer then usually serves as a mask for further etching processes.

After a final etching process, it usually becomes necessary to remove the remaining portions of the photoresist layer before a next process or process step is applied. For removing organic material such as photoresist material from a semiconductor wafer it is common to use fluid acids with ingredients such as sulphuric acid and hydrogen peroxide. To this end, the fluid acid is enclosed in a reactor or a fluid bath container in which at least one semiconductor wafer with a deposited layer of photoresist material is to be inserted. In the removing process, the organic material carbon components of the photoresist material are oxidized and form reaction products such as carbon dioxide, the hydrogen components are formed into water. The fluid acid (so-called piranha bath) usually is heated up to e.g. 130° C.

In such a process one often has to deal with the problem that photoresist residues are left on the wafer after the process ends. Also, some implanted kinds of resist are difficult to strip. Good tuning of the process is necessary. Under microscope it is very difficult to detect residuals of photoresist. Wafers having photoresist residues left on the wafer surface usually do not fulfill the strong requirements of modern semiconductor manufacturing. Photoresist residues can have a negative influence with respect to the process or process steps.

SUMMARY OF THE INVENTION

It is accordingly an object of the invention to provide a method for detecting the removal of organic material from a semiconductor device in a manufacturing process that overcomes the above-mentioned disadvantages of the prior art methods of this general type, which is suitable for detecting an incomplete removal of organic material, i.e. photoresist deposited on a processed semiconductor device.

With the foregoing and other objects in view there is provided, in accordance with the invention, a method for detecting the removal of organic material from semiconductor devices in a manufacturing process. The method includes inserting at least one semiconductor device having deposits of the organic material into a fluid for removing the organic material from the semiconductor device, producing measurement data for measuring a concentration of at least one reaction product formed by a reaction of the organic material and the fluid, and processing the measurement data to get a data curve. The semiconductor device is removed from the fluid. At least one of a turning point in the data curve, a local maximum point in the data curve and a local minimum point in the data curve are queried. The turning point of the data curve, the local maximum point of the data curve and the local minimum point of the data curve are each significantly different from signal noise after removing the semiconductor device from the fluid. A decision is made as to whether further processing of the semiconductor device is needed in dependence on the query results.

The method is applicable to various semiconductor devices with deposited organic material such as wafers for the manufacturing of semiconductor chips. For example, the semiconductor device contains a deposited layer of photoresist material. Moreover, various types of fluids can be used which are suitable for removing the organic material from the semiconductor device. Especially, a fluid is used having ingredients for removing the photoresist material. Preferably, sulphuric acid and at least one of hydrogen peroxide or ozone are inserted as fluid ingredients for removing photoresist material.

According to the invention, a clear identification even of small process problems that can lead to resist residues on a semiconductor device is made possible. The semiconductor device with deposited organic material is inserted into the fluid for removing the organic material from the semiconductor device. Then, measurement data are produced when measuring a concentration of at least one reaction product formed by the reaction of the organic material and the fluid. The measurement data are then processed to get a data curve.

In the case of resist residues left on the wafer, a concentrated dark piranha/resist mixture drops back into the fluid of the bath from the wafer during wafer removal at the process ends. This results in a clear turning point of the curve, a local maximum point of the curve and a local minimum point of the curve each being significantly different from signal noise, since the concentration of the measured reaction product changes quite rapidly. So, according to the invention, with querying for at least one of such a turning point, a local maximum point or a local minimum point of the curve after the process ends an incomplete removal of organic material, i.e. photoresist deposited on the processed semiconductor device can be detected. To this end, only easy mathematical calculations are necessary. This information then can serve as a basis for deciding on further processing of the semiconductor device dependent on the query result.

Preferably, the concentration of the at least one reaction product is measured with an optical sensor system. To this end, the system measures the transparency of the process fluid. The optical sensor system emits optical radiation and receives emitted optical radiation. Thereby, the optical radiation is emitted towards the fluid. With the receiving of the optical radiation that is transmitted through the fluid the transparency of the process fluid can be detected. The process fluid is not clear if it contains unoxidized portions of the removed organic material. The method can be fully automated. The signal produced by the optical sensor system is independent on normal pollution effects since the signals influenced by such effects are usually not in the course of the data curve. Therefore, the effects can easily be filtered.

The insertion of at least one of the ingredients such as hydrogen peroxide can be controlled due to the sensor signal. The controlling of the insertion can be performed in a manner that the consumption of the hydrogen peroxide in relation to the process time is optimized.

If the received optical radiation intensity is filtered with respect to minima signal peaks an influence of bubbles induced by the process can be overcome. The bubble-induced minima peaks of the sensor signal resulting from scattered light are then filtered.

In accordance with an added mode of the invention, there is the step of inserting the semiconductor device into the fluid for continued processing if one of the turning point of the data curve, the local maximum point of the data curve or the local minimum point of the data curve is detected.

In accordance with an additional mode of the invention, there is the step of marking the semiconductor device as a faulty device and sorting out the semiconductor device from the manufacturing process if one of the turning point of the data curve, the local maximum point of the data curve or the local minimum point of the data curve is detected.

In accordance with another mode of the invention, there is the step of querying for at least two turning points of the data curve after the semiconductor device is removed from the fluid.

In accordance with a further mode of the invention, there is the step of smoothing the data curve when processing the measurement data.

In accordance with a concomitant mode of the invention, there is the step of inserting the semiconductor device having at least one layer of photoresist material into the fluid.

Other features which are considered as characteristic for the invention are set forth in the appended claims.

Although the invention is illustrated and described herein as embodied in a method for detecting removal of organic material from a semiconductor device in a manufacturing process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic, cross-sectional view of a wafer; and

FIGS. 4 and 5 are graphs showing a measured sensor signal in relationship to process time.

DESCRIPTION OF THE PREFERRED EMBODIMENTS

Figure 1:
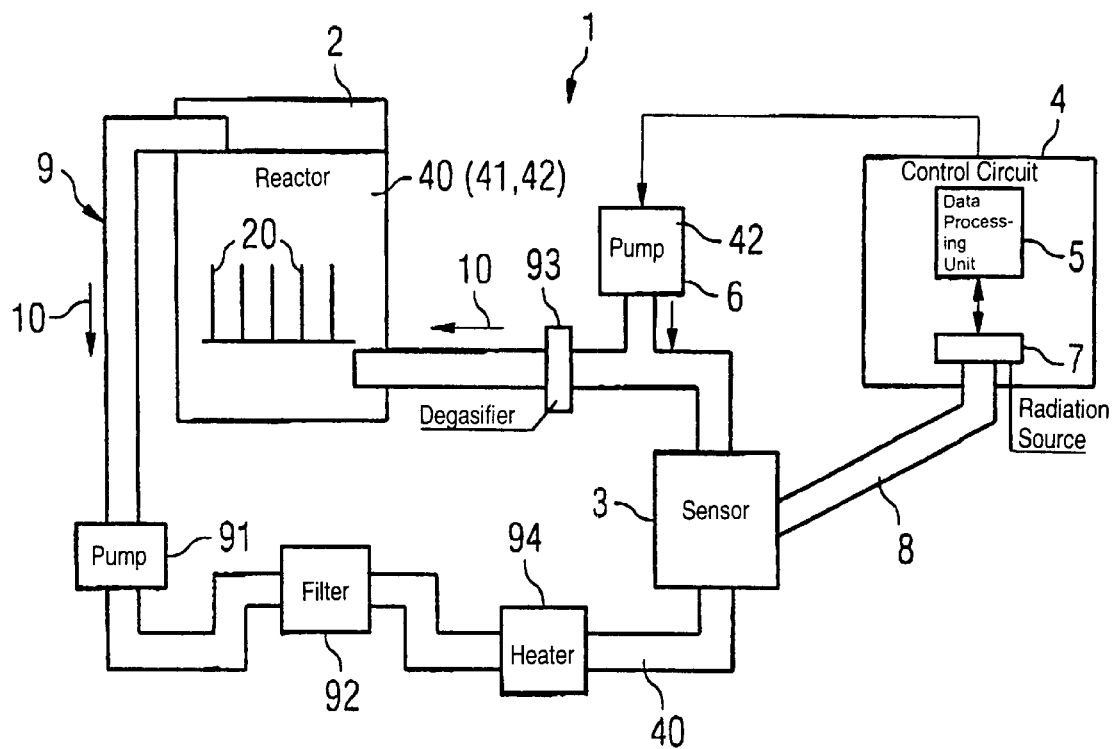
FIG. 1 is a block diagram of an embodiment of a processing configuration according to the invention.

Referring now to the figures of the drawing in detail and first, particularly, to FIG. 1 thereof, there is shown an embodiment of a processing configuration 1. The configuration 1 contains a reactor 2 for enclosing semiconductor devices 20 such as wafers 20. For example, the reactor 2 is suitable for enclosing a number of up to 50 wafers 20 piled up in a suitable clamping device. The reactor 2 can be formed as a bath or as a closed reactor with pipes connected to it. The wafers 20 have at least one deposited layer of photoresist material that is to be removed. In the reactor 2 also a fluid 40 having ingredients 41 and 42 for removing the photoresist material from the wafers 20 is enclosed. This type of process fluid is also known as a so-called piranha bath.

Further, the configuration 1 contains a fluid pipe system 9 for inserting the fluid 40 into the reactor 2 and for removing the fluid 40 from the reactor 2. The fluid pipe system 9 contains a pump 91 for pumping a fluid stream 10 through the fluid pipe system 9. Further, the fluid pipe system 9 contains a filter 92 for extracting particles out of the fluid 40 and a degasifier 93 for removing bubbles from the fluid 40, each of them placed at exemplified positions. The fluid pipe system 9 then contains a heater 94 for heating the fluid 40 up to e.g. 130° C. An optical sensor system 3 is integrated into the fluid pipe system 9.

The fluid 40 contains sulphuric acid 41 ($H_2SO_4$) and hydrogen peroxide 42 ($H_2O_2$) as fluid ingredients. Additionally, ozone ($O_3$) can be inserted as further ingredient of the fluid 40. With a spiking pump 6 the insertion of the hydrogen peroxide 42 into the fluid pipe system 9 is controlled. The spiking pump 6 is connected to a control circuit 4 containing a data processing unit 5. The spiking pump 6 is controlled by the control circuit 4. The data processing unit 5 and the respective control circuit 4 are connected to the optical sensor system 3 by an optical cable 8. The control circuit 4 further contains a radiation source 7 for emitting optical radiation that is transferred via the optical cable 8 to the optical sensor system 3 to detect the transparency of the fluid 40. For example, the radiation source 7 contains a laser device or a light emitting diode for emitting optical radiation with a single wavelength. When insufficient processing is indicated with the signal of system 3, the process may automatically be repeated.

Figure 2:
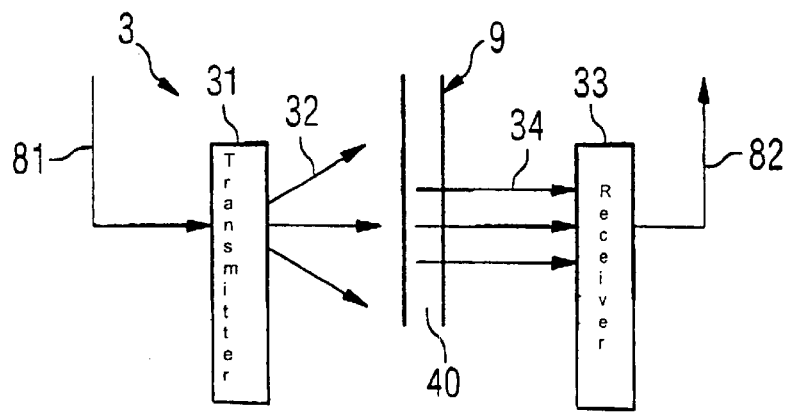
FIG. 2 is a block diagram of a more detailed view of an optical sensor system.

FIG. 2 shows a more detailed view of the optical sensor system 3. The pipe of the fluid pipe system 9 containing the fluid 40 is disposed in a center of the optical sensor system 3. The optical sensor system 3 contains a sender 31 for emitting optical radiation 32 towards the fluid 40. The optical radiation 32 is provided by an optical fiber 81 that is part of the optical cable 8 according to FIG. 1. The radiation 32 that is to be emitted is transmitted from the radiation source 7 via the optical fiber 81. The optical sensor system 3 further contains a receiver 33 for receiving emitted optical radiation. Especially, the receiver 33 is configured for receiving the optical radiation 34 that is transmitted through the fluid 40. A value reflecting the received optical radiation 34 is transmitted to the control circuit 4 via the optical fiber 82 as part of the optical cable 8.

FIG. 3 schematically shows a cross-sectional view of one of the wafers 20 enclosed in the reactor 2 according to FIG. 1. The wafer 20 is deposited with layers 21 and 22. Layer 22 is formed of photoresist material irradiated in a lithographic process. The photoresist layer 22 forms a mask for etching the layer 21. After the etching process, trenches are formed as shown in FIG. 3. In a following process, the remaining portions of the photoresist layer 22 have to be removed by inserting the wafer 20 into the reactor 2 according to FIG. 1.

With the optical sensor system 3 the transmission of light (preferably wavelength of about 550 nm) through the fluid 40 is measured. When removing the photoresist material 22 from the wafer 20 the fluid 40 changes its transparency (visible as a color change). When the removed photoresist material is fully oxidized, the fluid 40 is nearly as clear as at the beginning of the process. The described change of transparency can be measured by the optical sensor system 3. If minima signal peaks of the received optical radiation intensity are filtered, the result of the measurement is not influenced by induced bubbles that lead to scattering of the transmitted radiation.

FIG. 4 shows a diagram of a measured sensor signal I in relationship to process time t. The sensor signal I is derived from the detected optical radiation intensity measured by the optical sensor system 3. In this example, the optical radiation intensity is detected and transformed into a voltage signal. The data curve and respective signals are measured and processed with a very high signal-to-noise-ratio. The diagram schematically shows an example of a process for removing photoresist materials deposited on the wafer 20. Preferably, the data curve is smoothed when processing the measurement data.

The process begins with the time t0. The large decrease of curve K1 at a beginning of the process denotes the extent of the dissolution of the photoresist material to a high number of reaction products. Since a relative high amount of unoxidized portions in the stripped-off photoresist material occurs at the beginning of the process, the absorption of the transmitted light through the fluid 40 is quite large. Therefore, the transparency is quite low, the signal I decreases. With the inserting of hydrogen peroxide 42 into the fluid 40 the process of oxidation of the photoresist material is established. This is illustrated with the increase in curve K1. The time t1 denotes the end of the process.

Figure 5:
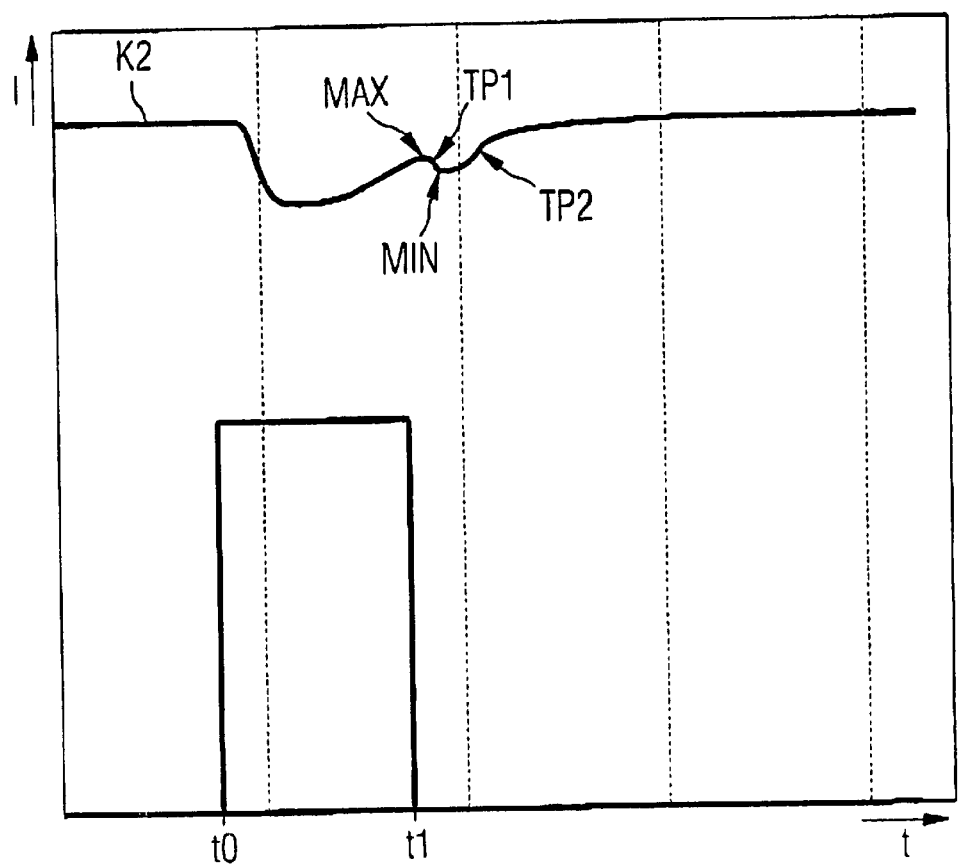

FIG. 5 shows a diagram of the measured sensor signal I in relationship to the process time t in the case where the photoresist hasn't been removed completely at the process end. Again, the process begins with the time t0. The large decrease in curve K2 at the beginning of the process denotes the extent of the dissolution of the photoresist material to a high number of reaction products. During wafer removal from the bath after the process end (time t1), a concentrated dark piranha/resist mixture results from resist residues dropping back into the fluid of the bath from the raised wafer. This results in a clear turning point TP1 of the curve, a local maximum point MAX of the curve and a local minimum point MIN of the curve each being significantly different from signal noise. The concentration of the reaction product and, consequently, the color of the bath changes quite rapidly when removing a wafer still having unoxidized portions of photoresist.

According to the invention, with querying for at least one of a turning point TP1, a local maximum point MAX or a local minimum point MIN of the curve K2 after the process ends an incomplete removal of the photoresist deposited on the processed wafer can be detected. The information serves as a basis for deciding on further processing of the wafer dependent on the query result. In the case where at least one of the turning point TP1 of the curve, the local maximum point MAX or the local minimum point MIN of the curve K2 is detected the wafer is inserted back into the bath for continued processing. Alternatively, the wafer is marked as faulty and sorted out of the manufacturing process.

In another embodiment of the invention a query for at least two turning points TP1 and TP2 of the curve K2 after removing the wafer from the fluid is established. The information can serve as a precise basis for distinguishing the curve K2 (wafer having deposited resist residues) from curve K1 shown in FIG. 4.

We claim:

1. A method for detecting removal of organic material from semiconductor devices in a manufacturing process, vhich comprises the steps of:

inserting at least one semiconductor device having deposits of the organic material into a fluid for removing the organic material from the semiconductor device;

producing measurement data for measuring a concentration of at least one reaction product formed by a reaction of the organic material and the fluid;

processing the measurement data to get a data curve;

removing the semiconductor device from the fluid;

querying for at least one of a turning point in the data curve, a local maximum point in the data curve and a local minimum point in the data curve, the turning point of the data curve, the local maximum point of the data curve and the local minimum point of the data curve each being significantly different from signal noise after removing the semiconductor device from the fluid;

producing the turning point of the data curve, the local maximum point of the data curve and the local minimum point of the data curve by dropping back a concentrated mixture of the fluid and the organic material into the fluid; and making a decision to further process the semiconductor device in dependence on query results.

2. The method according to claim 1, which comprises inserting the semiconductor device into the fluid for continued processing if one of the turning point of the data curve, the local maximum point of the data curve or the local minimum point of the data curve is detected.

3. The method according to claim 2, which comprises marking the semiconductor device as a faulty device and sorting out the semiconductor device from the manufacturing process if one of the turning point of the data curve, the local maximum point of the data curve or the local minimum point of the data curve is detected.

4. The method according to claim 1, which comprises querying for at least two turning points of the data curve after the semiconductor device is removed from the fluid.

5. The method according to claim 1, which comprises smoothing the data curve when processing the measurement data.

6. The method according to claim 1, which comprises measuring the concentration of the reaction product formed by the reaction of the organic material and the fluid by the steps of:

emitting optical radiation towards the fluid;

receiving the optical radiation transmitted through the fluid; and detecting an intensity of the optical radiation received.

7. The method according to claim 6, which comprises filtering the intensity of the optical radiation received with respect to minima signal peaks.

8. The method according to claim 1, which comprises inserting sulphuric acid and at least one of hydrogen peroxide and ozone as ingredients into the fluid.

9. The method according to claim 1, which comprises inserting the semiconductor device having at least one layer of photoresist material into the fluid.

* * * * *